(12) United States Patent
Shimada (10) Patent No.: US 6,432,743 B2
(45) Date of Patent: Aug. 13, 2002

(54) METHOD OF MANUFACTURING SEMICONDUCTOR DEVICE

(75) Inventor: Masao Shimada, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/840,578

(22) Filed: Apr. 23, 2001

(30) Foreign Application Priority Data

Apr. 25, 2000 (JP) ........................................ 2000-124721

(51) Int. Cl.[7] .............................................. H01L 21/44
(52) U.S. Cl. ...................... 438/107; 438/114; 438/125; 438/126; 438/113; 438/118; 438/127
(58) Field of Search ................................. 438/107, 113, 438/114, 118, 125, 126, 127

(56) References Cited

U.S. PATENT DOCUMENTS 6,113,733 A * 9/2000 Eriguchi et al. ............ 156/345
6,228,684 B1 * 5/2001 Maruyama .................. 438/112

FOREIGN PATENT DOCUMENTS

JP 2-22841 1/1990 ............ H01L/21/78

* cited by examiner

Primary Examiner—Richard Elms
Assistant Examiner—Pho M. Luu
(74) Attorney, Agent, or Firm—Hayes Soloway P.C.

(57) ABSTRACT

A surface of a semiconductor wafer having a plurality of semiconductor elements thereon is laminated on a first wafer holding substrate. Subsequently, the whole rear surface of the semiconductor wafer is coated with a first conductive layer. Then a second conductive layer is selectively formed thereon. Then, a rear surface side glass substrate is laminated on the first and second conductive layer. Subsequently, the first wafer holding substrate is peeled off. Subsequently, the semiconductor wafer is selectively etched so as to be separated into semiconductor elements. Then, the first conductive layer is connected to a ground potential to measure electrical characteristics of the semiconductor elements and sort the semiconductor elements into non-defectives and defectives. Then, the first conductive layer is selectively etched so as to be separated into chips and thus semiconductor pellets are formed. Finally, the second wafer holding substrate is peeled off.

11 Claims, 7 Drawing Sheets

FRONT SURFACE

REAR SURFACE

METHOD OF MANUFACTURING SEMICONDUCTOR DEVICE

BACKGROUND OF THE INVENTION

1. Field of the Invention

The present invention relates to a method of manufacturing a semiconductor device. In particular, the present invention relates to a method of manufacturing a semiconductor device by which characteristics of a semiconductor device can be evaluated in a wafer state.

2. Description of the Related Art

Compound semiconductors such as GaAs or the like have a higher electron mobility than that of Si, thereby having an excellent high frequency characteristic as compared with Si. Therefore, compound semiconductors are being applied to a field effect transistors (FET), which is a semiconductor element, such as a metal-semiconductor field effect transistor (hereinafter, referred to as MESFET) for high-speed operation utilizing a Schottky junction gate, and a semiconductor integrated circuit such as an integrated analog signal amplifier, digital signal amplifier or the like. Along with the recent increases in an operation speed of such a semiconductor element used as a semiconductor device or semiconductor integrated circuit. A semiconductor element having an operation frequency of 100 GHz is being put in practice today. As a result, the high frequency characteristic of a semiconductor element is becoming increasingly important.

Figure 1:
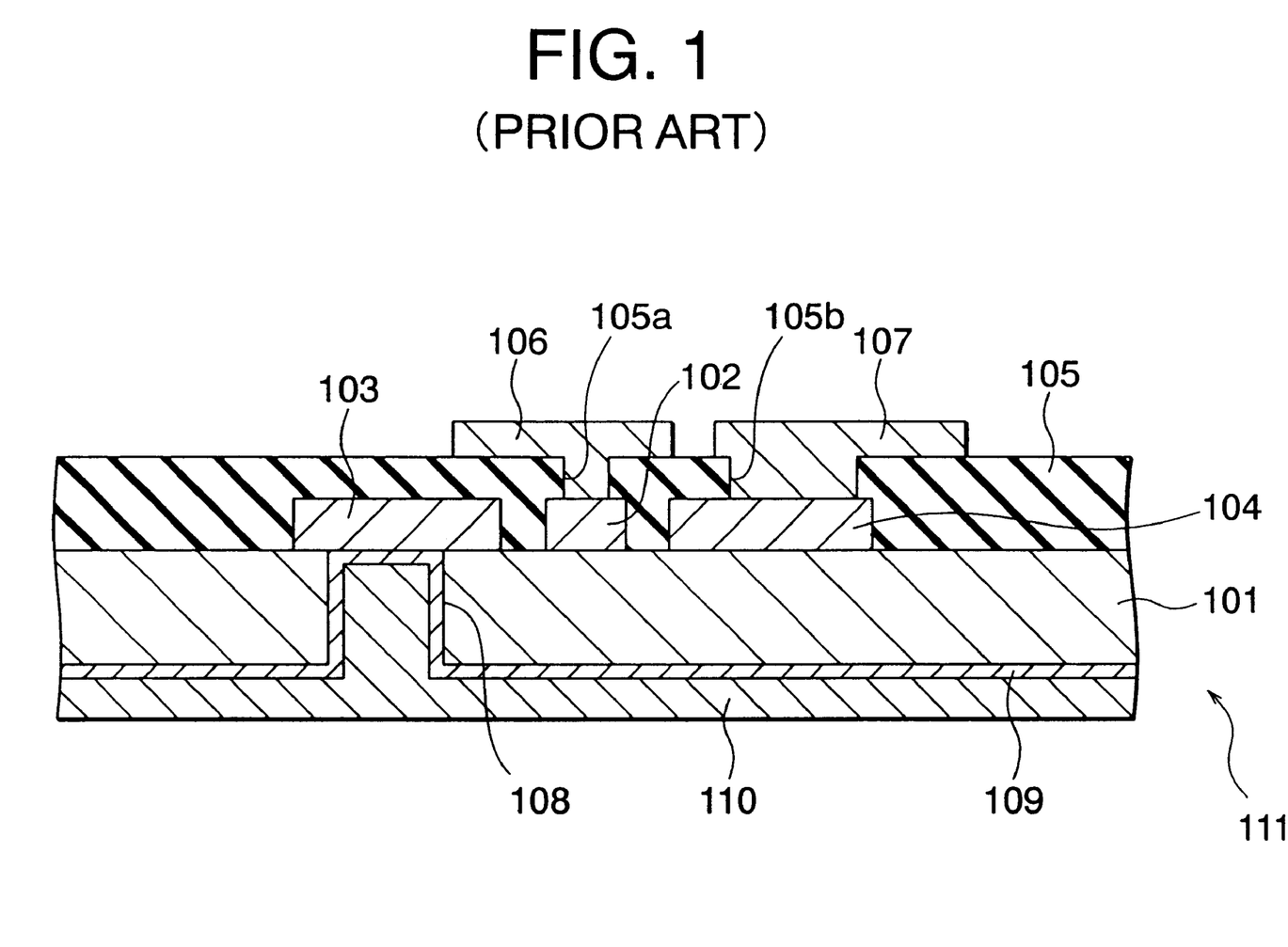
FIG. 1 is a cross sectional view showing a construction of a conventional semiconductor pellet.

Conventionally, various methods have been proposed as a method of manufacturing such a semiconductor element. These techniques widely used in manufacturing processes of mass production include, for example, a technique disclosed as prior art in Japanese Patent Laid-Open Publication No. Hei 2-022841. FIG. 1 is a cross sectional view showing a construction of a semiconductor pellet in this prior art. FIGS. 2A to 2D are perspective views showing a method of manufacturing this conventional semiconductor pellet in the order of process steps. The prior art will be described below with reference to FIG. 1 and FIGS. 2A to 2D.

First, an outline of the construction of this conventional semiconductor pellet will be explained with reference to FIG. 1. An MESFET is formed as a semiconductor element in this semiconductor pellet. In the semiconductor pellet 111 shown in FIG. 1, a source electrode 103 and drain electrode 104 are formed with a gate electrode 102 therebetween on a GaAs substrate 101. The gate electrode 102 and drain electrode 104 are connected to a gate lead electrode 106 and drain lead electrode 107 via apertures 105a, 105b, respectively, provided in an interlayer insulating film 105. On the other hand, the source electrode 103 is connected to a metal layer 109 for plating and gold plating layer 110 laminated on the rear surface of the GaAs substrate 101 via a through hole (via hole) 108 provided in the GaAs substrate 101. These laminated metal layer 109 for plating and gold plating layer 110 constitute a lead electrode of the source electrode 103. The gold plating layer 110 also functions as a plated heat sink (PHS). This semiconductor pellet 111 is thus constructed, having a length of about 0.5–2 mm.

Figure 2A:
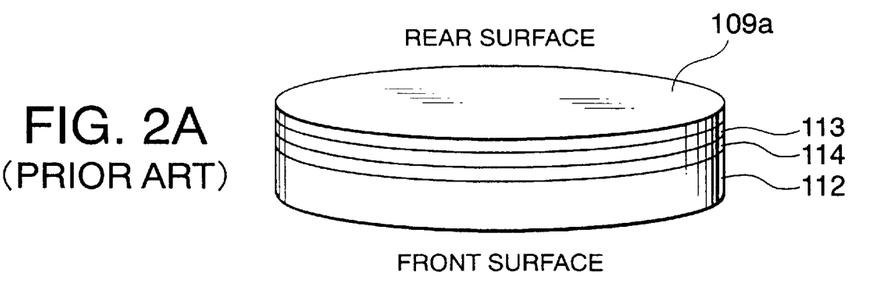
FIGS. 2A to 2D are perspective views showing a method of manufacturing the conventional semiconductor pellet in the order of process steps.

A method of separating the semiconductor elements as chips will be explained below with reference to FIGS. 2A to 2D. The same component elements as those explained in FIG. 1 are designated by the same reference numerals through FIGS. 2A to 2D. As shown in FIG. 2A, a GaAs wafer 113 having semiconductor elements formed thereon is laminated onto a glass substrate 112 via a low melting point wax 114 with a surface of the GaAs wafer 113 on which the semiconductor elements are formed (hereinafter, referred to as front surface) facing the glass substrate 112 side. Then, a known method is employed to form the GaAs wafer 113 into a thin layer having a thickness of, for example, 40 μm. Subsequently, through holes 108 (see FIG. 1) are formed in prescribed regions. Then, a metal film 109a for plating is formed on the whole surface of the GaAs wafer 113 on which the semiconductor elements are not formed (hereinafter, referred to as rear surface).

Figure 2B:
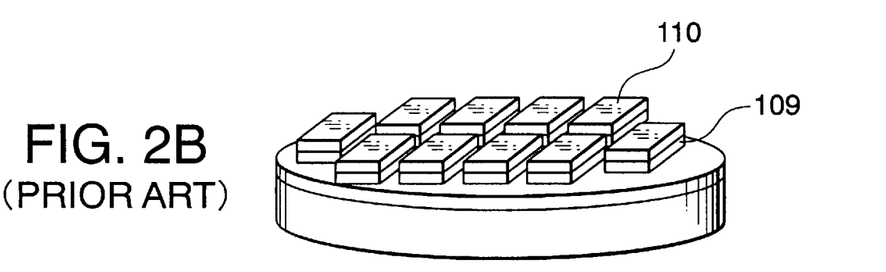

Subsequently, as shown in FIG. 2B, a gold plating layer 110 is selectively formed on the metal film 109a for plating by a known method using a photoresist pattern. Then, the metal film 109a for plating is patterned by using this gold plating layer 110 as a mask to form the aforementioned metal layer 109 for plating.

Figure 2C:
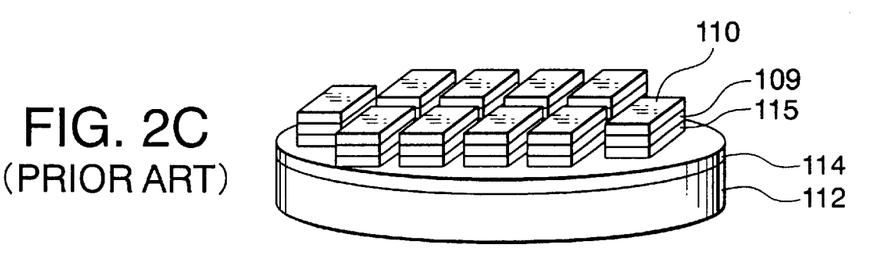

Subsequently, as shown in FIG. 2C, the GaAs wafer 113 is etched by using the gold plating layer 110 as a mask. Consequently, the GaAs wafer 113 is separated into chips to form semiconductor elements 115. Then, the low melting point wax 114 is melted by heating to a temperature equal to the melting point thereof or higher to peel off the glass substrate 112 from the semiconductor elements 115. Then, the semiconductor elements 115 are washed with an organic solvent.

Figure 2D:
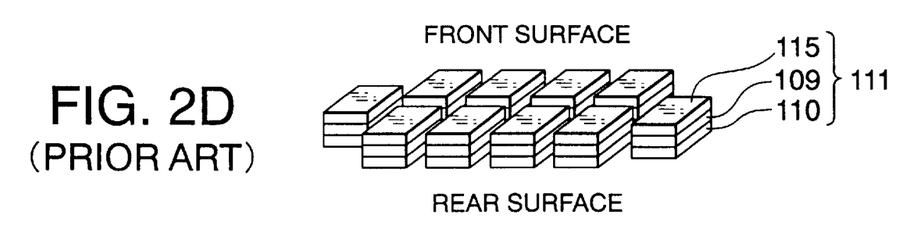

Thus, a semiconductor pellet 111 composed of the semiconductor element 115, metal layer 109 for plating and gold plating layer 110 is formed as shown in FIG. 2D. The metal layer 109 for plating is formed on the rear surface of the semiconductor element 115 and the gold plating layer 110 is further formed on top thereof.

Subsequently, the high frequency (RF) characteristics of all the semiconductor pellets 111 separated into chips as described above are measured. According to the results of the measurement, the semiconductor pellets 111 are sorted into non-defectives and defectives (hereinafter, referred to as non-defectives/defectives screening).

In the prior art, as described above, the GaAs wafer 113 is separated into chips to form semiconductor pellets 111 and then electrical characteristics such as an RF characteristic and so forth of each semiconductor element 115 formed in the semiconductor pellet 111 are individually measured. In this method, however, a large number of processes are required for sorting the semiconductor pellets 111 into non-defectives and defectives, thereby increasing a manufacturing cost of the semiconductor pellets 111.

To solve this problem, not all the semiconductor pellets formed by separating one GaAs wafer into chips are subjected to measurement of electrical characteristics, but several of the semiconductor pellets formed from one GaAs wafer are selected to measure the electrical characteristics thereof and thus the quality of the whole GaAs wafer is judged. However, this method is not practical in mass production since defective semiconductor pellets are often mixed in the GaAs wafer determined as non-defective.

In addition, since electrical characteristics of an individual semiconductor element are measured in the prior art, inductance increases between electrodes of the semiconductor element and probes of a measuring apparatus during the measurement. The inductance of a ground electrode, in particular, increases and a problem arises that the electrical characteristics cannot be precisely measured.

SUMMARY OF THE INVENTION

An object of the present invention is to provide a method of manufacturing a semiconductor device by which non-defectives/defectives screening can be conveniently performed by measuring electrical characteristics of semiconductor elements and the semiconductor elements can be precisely screened by reducing inductance of a ground electrode.

A method of manufacturing a semiconductor device according to the present invention has the steps of: laminating a semiconductor wafer having a plurality of semiconductor elements on a first surface thereof onto a first wafer holding substrate by using a first adhesive so as to contact the first surface to the first wafer holding substrate; grinding a second surface of the semiconductor wafer on which the semiconductor elements are not formed to form a semiconductor wafer of a prescribed thickness; coating a first conductive layer on the whole second surface of the semiconductor wafer; selectively forming a second conductive layer on the first conductive layer in regions aligning to the semiconductor elements formed on the first surface of the semiconductor wafer; laminating a second wafer holding substrate on the first conductive layer and second conductive layer by using a second adhesive; melting the first adhesive to peel off the first wafer holding substrate from the semiconductor wafer and expose the first surface of the semiconductor wafer; selectively etching the semiconductor wafer from the exposed surface so as to be separated into semiconductor elements and partially expose the first conductive layer; evaluating the semiconductor elements so as to be sorted into non-defectives and defectives; selectively etching the exposed portion of the first conductive layer; and removing the second adhesive to peel off the second wafer holding substrate from the first and the second conductive layers.

Another method of manufacturing a semiconductor device according to the present invention has the steps of: laminating a semiconductor wafer having a plurality of semiconductor elements on a first surface thereof onto a first wafer holding substrate by using a first adhesive so as to contact the first surface to the first wafer holding substrate; grinding a second surface of the semiconductor wafer on which the semiconductor elements are not formed to form a semiconductor wafer of a prescribed thickness; coating a first conductive layer on the whole second surface of the semiconductor wafer; selectively forming a second conductive layer on the first conductive layer in regions aligning to the semiconductor elements formed an the first surface of the semiconductor wafer; selectively etching the first conductive layer by using the selectively formed second conductive layer as a mask; laminating a second wafer holding substrate on the second conductive layer by using a second adhesive, which is a conductor; melting the first adhesive to peel off the first wafer holding substrate from the semiconductor wafer and expose the surface of the semiconductor wafer; selectively etching the semiconductor wafer from the exposed surface so as to be separated into semiconductor elements and partially expose the second adhesive surface; evaluating the semiconductor elements so as to be sorted into non-defectives and defectives; and removing the second adhesive to peel off the second wafer holding substrate from the second conductive layer.

The first conductive layer may be electrically connected to a ground electrode of the semiconductor element formed on the semiconductor wafer surface, for example, a source electrode of an MESFET. Then, in screening of the semiconductor elements, the first conductive layer before selectively etched may be connected to a ground potential to measure electrical characteristics of the semiconductor element. Or, the first conductive layer may be electrically connected to a ground electrode of the semiconductor element formed on the semiconductor wafer surface, for example, a source electrode of an MESFET. Then, in screening of the semiconductor elements, the second conductive layer, which is a conductor, may be connected to a ground potential to measure electrical characteristics of the semiconductor element.

Furthermore, the semiconductor element may be a field effect transistor. Electrical characteristics measured in the non-defectives/defectives screening of a field effect transistor preferably include a high frequency characteristic. The reason for this is that the high frequency characteristic becomes important as an operation speed of the semiconductor element is increased.

The second adhesive, which is a conductor, may be a conductive paste such as a silver paste. The first adhesive can be a low melting point wax. Furthermore, at least one of the first wafer holding substrate and second wafer holding substrate may be a transparent substrate. This transparent substrate may be constituted by a glass plate, quartz plate or sapphire plate.

In the present invention, since the first conductive layer is connected to the ground electrode of the semiconductor element formed on the semiconductor wafer, for example, the source electrode of the field effect transistor, inductance of the ground electrode of this semiconductor element can be reduced to about the same level as that of a semiconductor element mounted in a package as a product. As a result, inductance on the source side of the semiconductor element is greatly reduced and thus a high frequency characteristic can be precisely measured.

In addition, since the first conductive layer is connected to the ground electrode of each semiconductor element, only one ground electrode can be used in screening of the semiconductor elements. Since a plurality of semiconductor elements formed on the semiconductor wafer before separated into chips are sorted into non-defectives and defectives and then the chips are separated, the semiconductor elements can be easily handled in screening of the semiconductor elements. As a result, the non-defectives/defectives screening can be precisely and conveniently performed for all the semiconductor elements formed on the semiconductor wafer. Therefore, the method of manufacturing a semiconductor device according to the present invention can be applied to mass production of semiconductor devices.

DETAILED DESCRIPTION OF THE PREFERRED EMBODIMENT

Embodiments of the present invention will be described in detail below with reference to the accompanying drawings.

Figure 3:
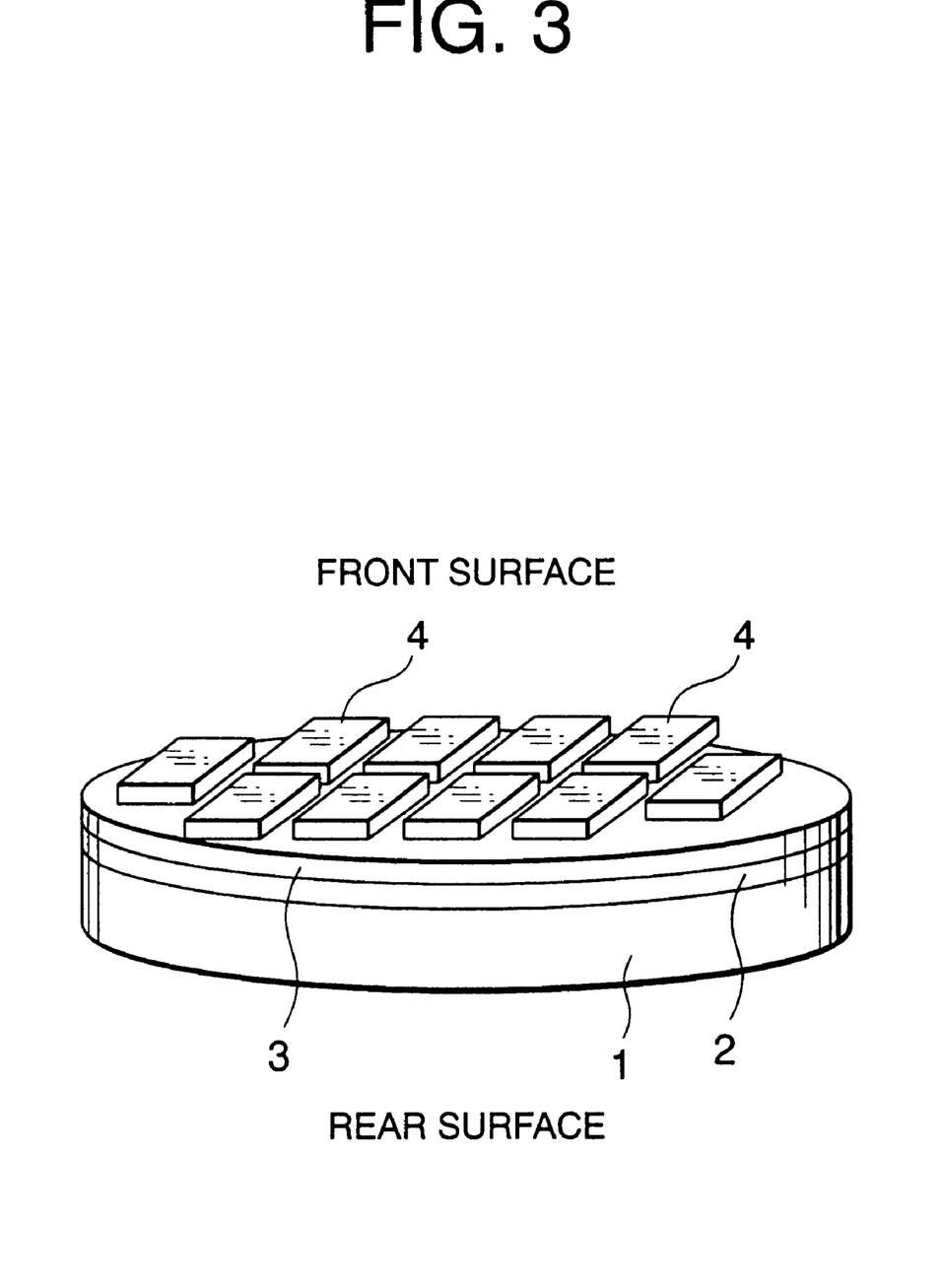
FIG. 3 is a perspective view showing characteristics of a semiconductor pellet manufacturing process according to a first embodiment of the present invention.

First, a first embodiment of the invention will be described. FIG. 3 is a perspective view showing characteristics of a semiconductor pellet manufacturing process according to this embodiment. FIGS. 4A to 4H are perspective views showing a method of manufacturing a semiconductor pellet according to this embodiment in the order of process steps. This embodiment is characterized in that a first conductive layer connected to a ground electrode of each semiconductor element is formed on the whole rear surface of a GaAs wafer formed into a thin film and that only the GaAs wafer is separated into chips without separating the first conductive layer so that electrical characteristics of all the semiconductor elements formed on the GaAs wafer are measured.

In this embodiment, the semiconductor element is an MESFET explained in FIG. 1. First, this embodiment will be explained with reference to FIG. 3. A metal film 3 which is used in plating as underlayer of plating (hereinafter called as a metal film for plating) is formed on the rear surface of a glass substrate 1 with a resist film 2 interposed therebetween. The metal film 3 for plating is the aforementioned first conductive layer connected to a source electrode of each semiconductor element. The resist film 2 functions as an adhesive. In this state, probes of a prober are connected to a gate lead electrode and drain lead electrode of the semiconductor element 4 (see FIG. 1). Further, the source electrode of the semiconductor element (see FIG. 1) is connected to the metal film 3 for plating while the metal film 3 for plating is connected to a ground potential (GND).

At this time, the metal film 3 for plating can be connected to the ground potential in a large contact area. Therefore, during measurement of, for example, a high frequency characteristic of the semiconductor element, inductance on the source side of the semiconductor element is stably reduced and thereby the high frequency characteristic can be precisely measured. Thus, non-defectives/defectives screening can be precisely performed for all the semiconductor elements on the GaAs wafer.

Figure 4A:
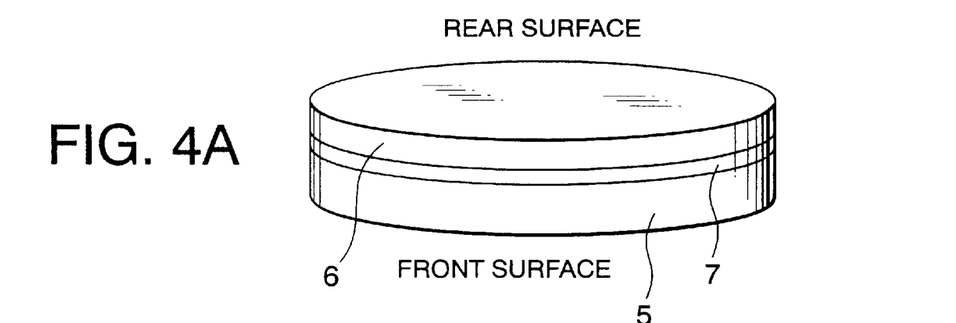
FIGS. 4A to 4H are perspective views showing a method of manufacturing a semiconductor pellet according to this embodiment in the order of process steps.

The method of manufacturing a semiconductor pellet according to this embodiment will be explained below in the order of manufacturing steps with reference to FIGS. 4A to 4H. As shown in FIG. 4A, a GaAs wafer 6 surface on which the semiconductor elements are formed is laminated on a front surface side glass substrate 5, which is a first wafer holding substrate, via a low melting point wax 7. The front surface side glass substrate 5 is transparent and the thickness thereof is, for example, 1 mm. The low melting point wax 7 constitutes a first adhesive. Subsequently, the GaAs wafer 6 is formed into a thin layer having a thickness of, for example, 40 μm. Then, through holes (see FIG. 1) are formed in prescribed regions of the GaAs wafer 6.

Figure 4B:
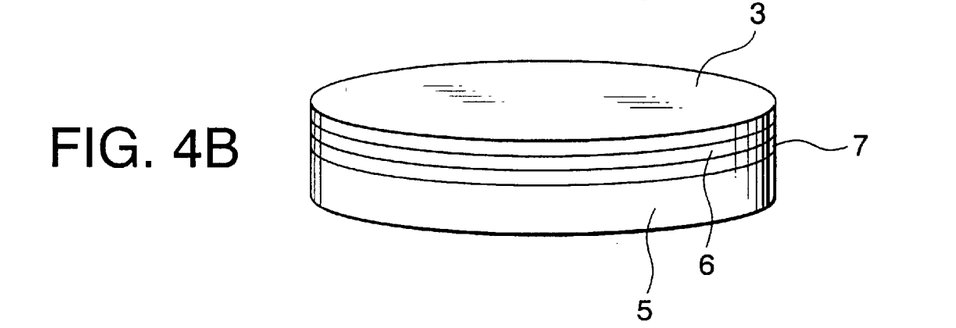

Subsequently, as shown in FIG. 4B, a metal film 3 for plating is formed on the whole rear surface of the thin GaAs wafer 6. The metal film 3 for plating is a laminated film obtained by successively depositing, for example, titanium (Ti) having a film thickness of 20 nm and gold (Au) having a film thickness of 300 nm in this order. The metal film 3 for plating is a first conductive layer.

Figure 4C:
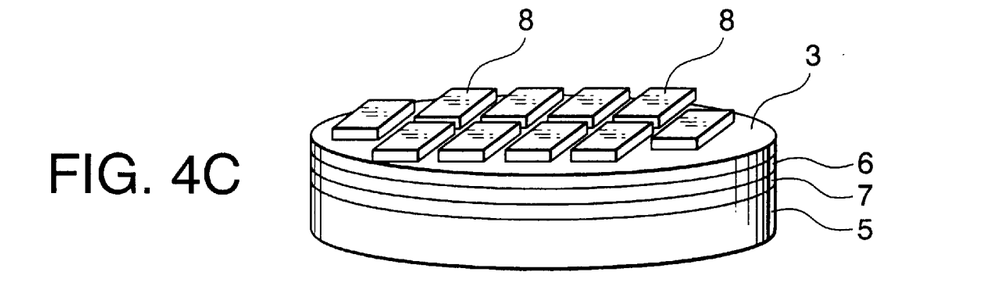

Subsequently, as shown in FIG. 4C, a gold plating layer 8 is selectively formed on the metal film 3 for plating by a known method using a photoresist pattern. The gold plating layer 8 is a second conductive layer. The film thickness of the gold plating layer 8 is, for example, 20 μm.

Figure 4D:
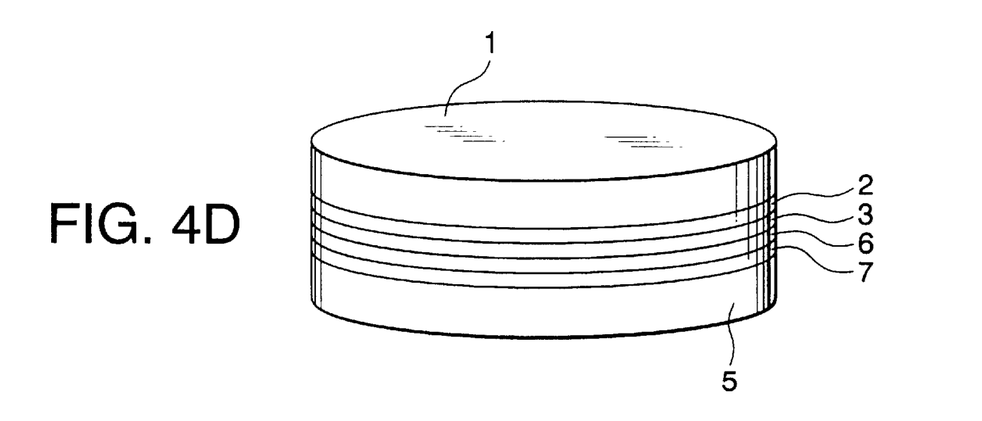

Subsequently, as shown in FIG. 4D, the metal film 3 for plating and gold plating layer 8 are laminated on a transparent rear surface side glass substrate 1 via a resist film 2. The resist film 2 is a second adhesive having a thickness of about 20 μm. The rear surface side glass substrate 1 is a second wafer holding substrate having a thickness of about 0.5 mm. At this time, the gold plating layer 8 (see FIG. 4C) is buried in the resist film 2. Thus, a laminate is formed by successively laminating the low melting point wax 7, GaAs wafer 6, metal film 3 for plating, resist film 2 and rear surface side glass substrate 1 on the front surface side glass substrate 5 in this order.

Figure 4E:
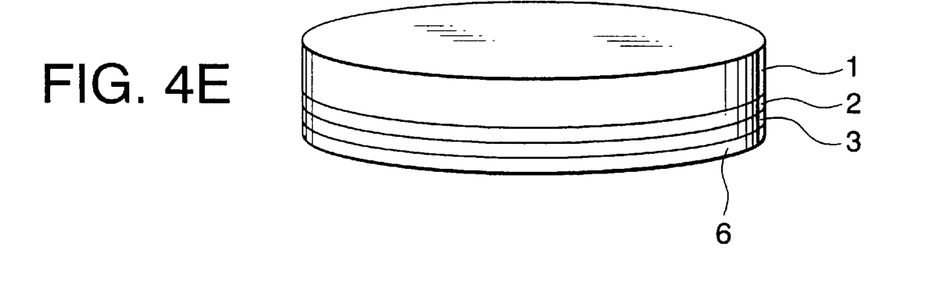

Subsequently, this laminate is heated to a temperature equal to a melting point of the low melting point wax 7 or higher, for example, 150 to 180° C. so that the low melting point wax 7 is melted to peel off the front surface side glass substrate 5 from the GaAs wafer 6. Then, the front surface of the GaAs wafer 6 is washed with an organic solvent. Consequently, as shown in FIG. 4E, the front surface of the GaAs wafer 6 is exposed.

Figure 4F:
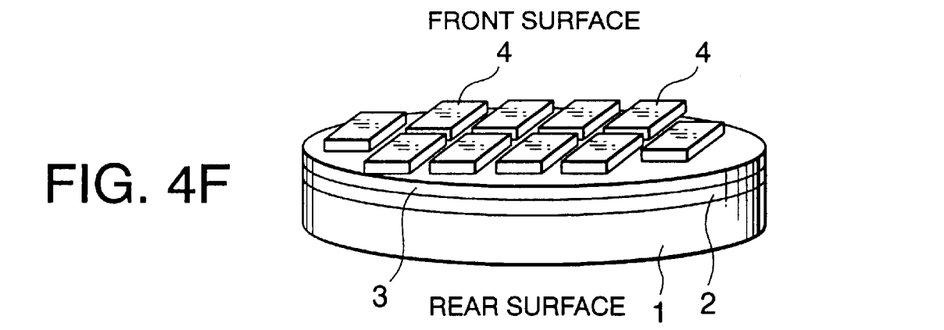

Subsequently, the GaAs wafer 6 is etched by using a photoresist film (not shown) as a mask and the GaAs wafer 6 is separated into a plurality of semiconductor elements 4. At this time, the positions of the photoresist film are adjusted by visually observing the pattern of the gold plating layer 8 through the transparent rear surface side glass substrate 1. In this etching process, only the GaAs wafer 6 is etched, but the metal film 3 for plating is not etched. FIG. 4F shows a construction of the laminate in this state composed of the semiconductor elements 4, metal film 3 for plating, gold plating layer 8 (not shown), resist film 2 and rear surface side glass substrate 1. FIG. 4F shows the construction in a vertically inverted position with respect to FIGS. 4A to 4E. FIG. 4F and FIG. 3 are the same view.

Subsequently, as explained with reference to FIG. 3, electrical characteristics of all the semiconductor elements 4 on the GaAs wafer 6 are measured for non-defectives/defectives screening. Then, defective semiconductor elements 4 are marked.

Figure 4G:
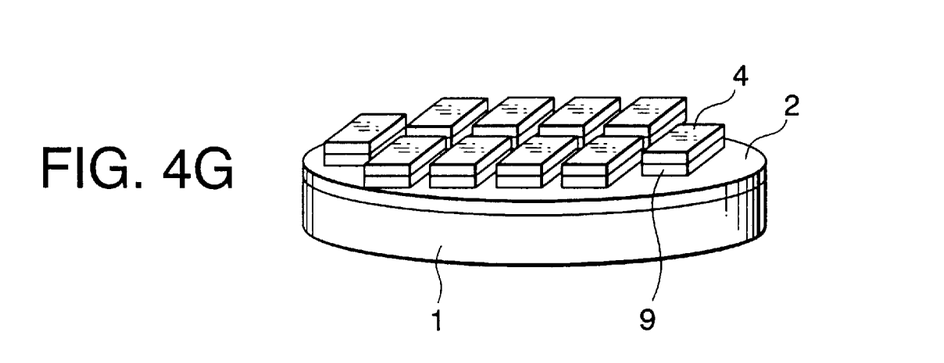

Subsequently, as shown in FIG. 4G, the metal film 3 for plating is etched and patterned by using the aforementioned photoresist film (not shown) as a mask by a method such as ion milling or the like. Thereby, a metal layer 9 is formed under the semiconductor elements 4. The metal layer 9 is formed by patterning the metal film 3 for plating. As a result, the resist film 2 is exposed.

Figure 4H:
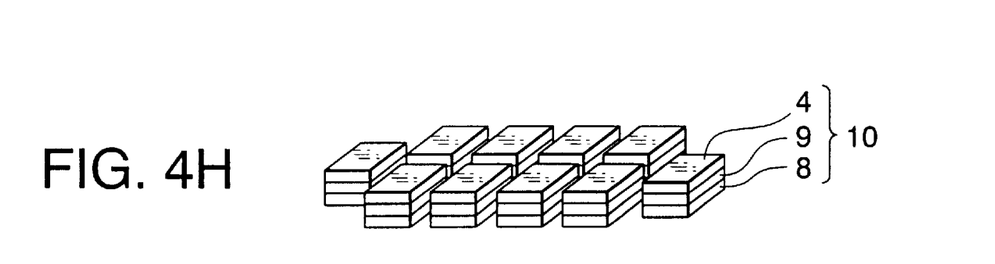

Subsequently, the resist film 2 is dissolved by using an organic solvent to peel off the rear surface side glass substrate 1 from the gold plating layer 8. As a result, as shown in FIG. 4H, a semiconductor pellet 10 composed of the metal layer 9 and gold plating layer 8 formed on the rear surface of the semiconductor element 4 can be obtained.

The method of manufacturing a semiconductor pellet according to this embodiment described above has effects described below as compared with a conventional method. First, a high frequency characteristic of the semiconductor element 4 can be precisely measured in non-defectives/defectives screening of the semiconductor elements 4 since inductance on the source side of the semiconductor element 4 can be greatly reduced. In addition, the method of manufacturing a semiconductor pellet of this embodiment can be applied to mass production since non-defectives/defectives screening of all the semiconductor elements 4 formed on a GaAs wafer 6 can be conveniently performed thereby.

A second embodiment of the present invention will be explained below. FIGS. 5A to 5G are perspective views showing semiconductor pellet manufacturing processes according to this embodiment in the manufacturing order of process steps. In FIGS. 5A to 5G, the same component elements as those in the abovedescribed first embodiment shown in FIGS. 4A to 4H are designated by the same reference numerals. The second embodiment is characterized in that a conductive paste such as a silver paste, which is an adhesive for laminating the GaAs wafer on the glass substrate, serves the function of the metal film for plating explained in the first embodiment.

While partially overlapped with the explanation of the above-described first embodiment, a method of manufacturing a semiconductor pellet according to this embodiment will be explained step by step below with reference to FIGS. 5A to 5G.

Figure 5A:
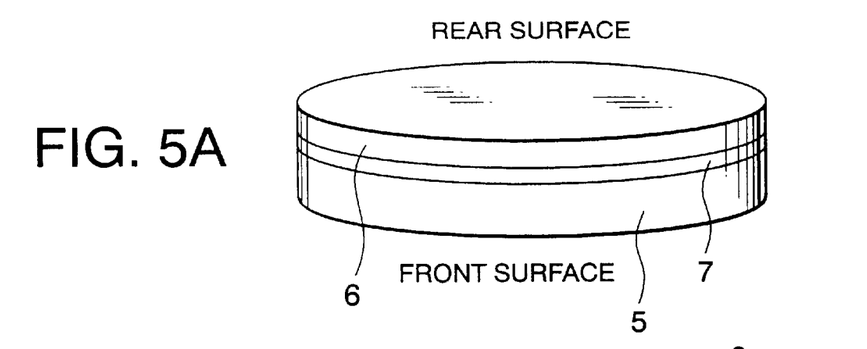
FIGS. 5A to 5G are perspective views showing a method of manufacturing a semiconductor pellet according to a second embodiment of the invention in the order of process steps.

First, as shown in FIG. 5A, the front surface of a GaAs wafer 6 is laminated on a front surface side glass substrate 5 via a low melting point wax 7. The front surface side glass substrate 5 is transparent and has a thickness of, for example, 0.5 mm. Subsequently, the GaAs wafer 6 is formed into a thin layer, reducing the thickness of the GaAs wafer 6 to, for example, 25 $\mu$m. Then, through holes (see FIG. 1) are formed in prescribed regions of the GaAs wafer 6 as explained in the prior art.

Figure 5B:
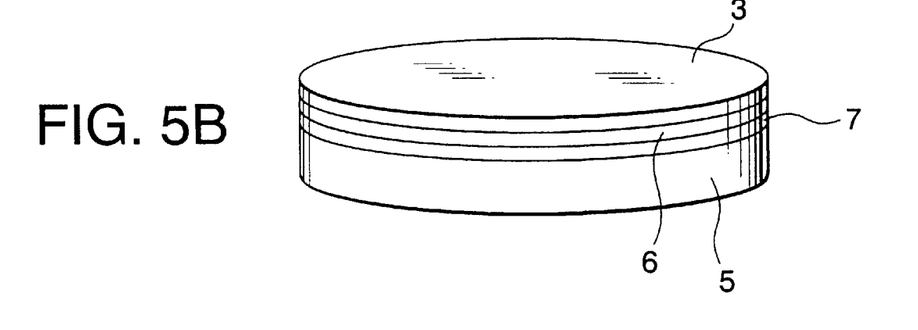

Subsequently, as shown in FIG. 5B, a metal film 3 for plating is formed on the whole rear surface of the thin GaAs wafer 6. The metal film 3 for plating is a laminated film composed of titanium (Ti) and gold (Au).

Figure 5C:
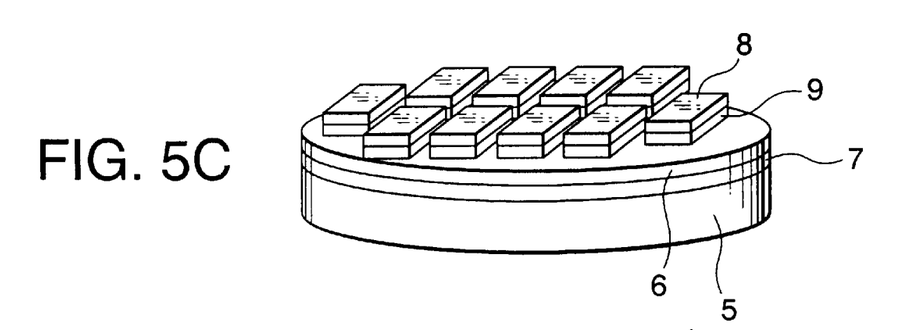

Subsequently, as shown in FIG. 5C, a gold plating layer 8 is selectively formed on the metal film 3 for plating by a known method using a photoresist pattern. The film thickness of the gold plating layer 8 is, for example, 10 $\mu$m. Subsequently, the metal film 3 for plating is etched and separated by using the gold plating layer 8 as a mask to form a metal layer 9.

Figure 5D:
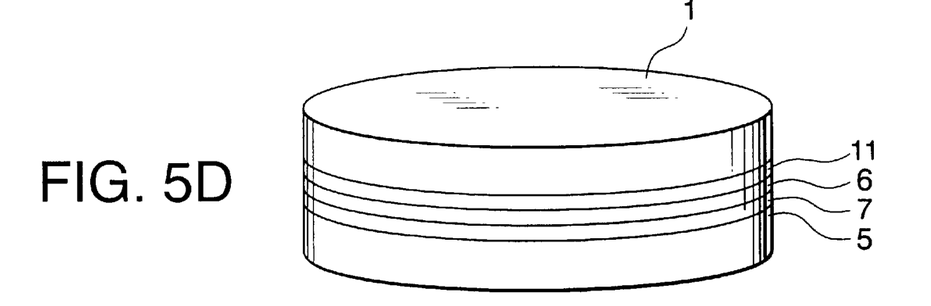

Subsequently, as shown in FIG. 5D, the rear surface of the GaAs wafer 6, that is, the surface on which the metal layer 9 and gold plating layer 8 (see FIG. 5C) are formed is laminated on the rear surface side glass substrate 1 via a silver paste 11. The film thickness of the silver paste 11 is about 20 $\mu$m. The silver paste 11 is a second adhesive, which is a conductor. At this time, the metal layer 9 and gold plating layer 8 (see FIG. 5C) are connected to the silver paste 11 while buried in the silver paste 11.

Figure 5E:
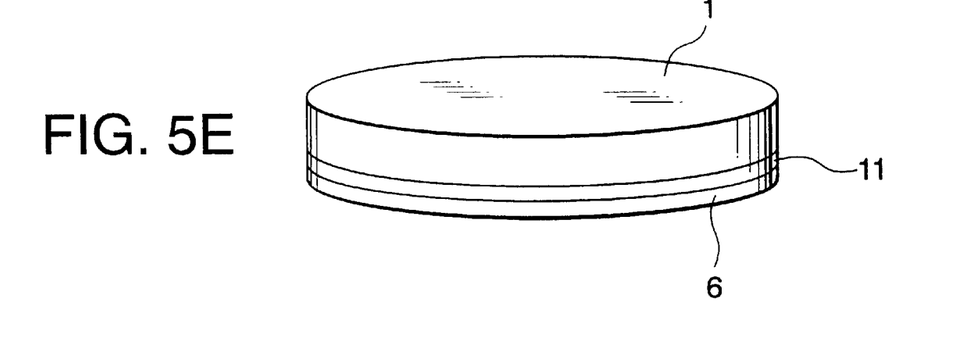

Subsequently, this laminate is heated to a temperature equal to a melting point of the low melting point wax 7 or higher so that the low melting point wax 7 is melted to peel off the front surface side glass substrate 5 from the GaAs wafer 6. Then, the front surface of the GaAs wafer 6 is washed with an organic solvent to expose the front surface of the GaAs wafer 6 as shown in FIG. 5E. Subsequently, the GaAs wafer 6 is etched by using a photoresist film (not shown) as a mask to separate the GaAs wafer 6 into a plurality of semiconductor elements 4.

Figure 5F:
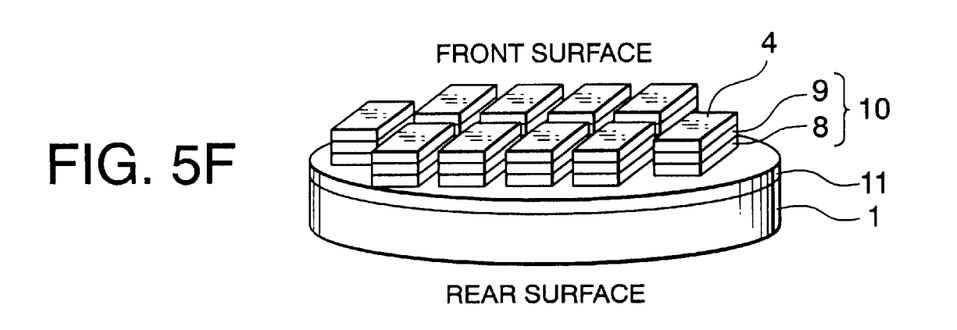

FIG. 5F shows a construction of the laminate in this state composed of the semiconductor elements 4, metal layer 9, gold plating layer 8, silver paste 11 and rear surface side glass substrate 1. FIG. 5F shows the construction in a vertically inverted position with respect to FIGS. 5A to 5E. In FIG. 5F, the metal layer 9 and gold plating layer 8 are projected from the silver paste 11, but the metal layer 9 and gold plating layer 8 may be buried in the silver paste 11. As shown in FIG. 5F, a semiconductor pellet 10 is constituted by the separated semiconductor element 4, metal layer 9 and gold plating layer 8. Thus, the separated semiconductor pellets 10 are laminated on the rear surface side glass substrate 1 via the silver paste 11.

Subsequently, as in the method explained in the first embodiment, electrical characteristics of all the semiconductor elements 4 on the GaAs wafer 6 are measured for non-defectives/defectives screening. Then, defective semiconductor elements 4 are marked. At this time, the whole surface of the silver paste 11 is connected to the ground potential (GND). Therefore, inductance on the source side of the semiconductor element 4 is greatly reduced.

Figure 5G:
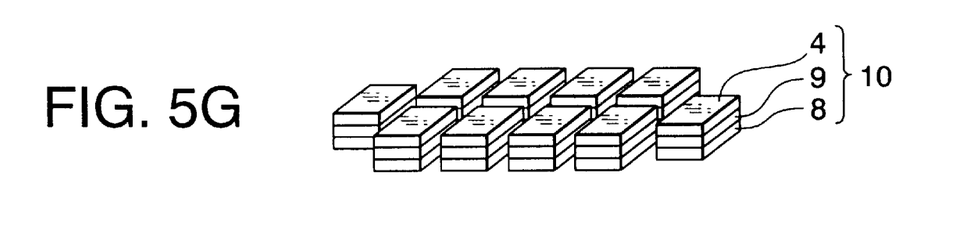

Subsequently, the silver paste 11 is melted and removed. Then, the rear surface side glass substrate 1 is peeled off from the semiconductor pellets 10. As a result, as shown in FIG. 5G, a semiconductor pellet 10 having the metal layer 9 and gold plating layer 8 formed on the rear surface of the semiconductor element 4 can be obtained.

In this embodiment, in addition to the effects of the above-described first embodiment, an effect can be obtained that inductance on the source side of the semiconductor element (MESFET) is further reduced.

Thus, in each of the above embodiments, in manufacturing processes of a high-speed semiconductor device mounted on a compound semiconductor such as GaAs or the like, the ground electrode of the semiconductor element formed on the semiconductor wafer is connected to the ground potential via a metal film for plating or silver paste before individual semiconductor pellets are separated. After electrical characteristics of the semiconductor elements are measured in this state for non-defectives/defectives screening, semiconductor chips are separated.

Consequently, inductance of a ground electrode side of the semiconductor element, for example, a source electrode can be greatly reduced during non-defectives/defectives screening of the semiconductor elements. Therefore, inductance of the ground electrode of the semiconductor element is made the same level as that of this semiconductor element mounted in a package as a product. As a result, a high frequency characteristic of the semiconductor element can be precisely measured. Furthermore, since non-defectives/defectives screening is conveniently performed for all the semiconductor elements formed on the semiconductor wafer, application to mass production becomes easy.

The above-described effects of the present invention become more evident as a MESFET or semiconductor integrated circuit has a shorter-wavelength drive frequency. Therefore, according to the present invention, higher performancer of a semiconductor element such as an MESFET or the like formed on a compound semiconductor can be further promoted.

In the above-described embodiments, details are explained in a case where the semiconductor element is an MESFET. In the present invention, however, the semiconductor element is not limited to an MESFET, but may be a high electron mobility transistor (HEMT), an FET such as a hetero-junction field effect transistor (HFET) or the like or a bipolar transistor of compound semiconductor. The present invention can be similarly applied to semiconductor pellets having such semiconductor elements as in the case of the above embodiments and similar effects can be obtained.

Furthermore, the present invention is not limited to the aforementioned embodiments, but it is apparent that each embodiment can be appropriately altered without departing from the scope of technical ideas of the present invention.

What is claimed is:

1. A method of manufacturing a semiconductor device comprising the steps of:
  laminating a semiconductor wafer having a plurality of semiconductor elements on a first surface thereof onto a first wafer holding substrate by using a first adhesive go as to contact said first surface to said first wafer holding substrate;

grinding a second surface of said semiconductor wafer on which the semiconductor elements are not formed to form a semiconductor wafer of a prescribed thickness;

coating a first conductive layer on the whole second surface of said semiconductor wafer;

selectively forming a second conductive layer on said first conductive layer in regions aligning to the semiconductor elements formed on said first surface of said semiconductor wafer;

laminating a second wafer holding substrate on the first conductive layer and second conductive layer by using a second adhesive;

melting the first adhesive to peel off the first wafer holding substrate from the semiconductor wafer and expose the first surface of the semiconductor wafer;

selectively etching the semiconductor wafer from the exposed surface so as to be separated into semiconductor elements and partially expose the first conductive layer, evaluating the semiconductor elements so as to be sorted into non-defectives and defectives;

selectively etching the exposed portion of the first conductive layer; and removing the second adhesive to peel off the second wafer holding substrate from the first and the second conductive layers.

2. The method of manufacturing a semiconductor device according to claim 1, wherein the first conductive layer is electrically connected to a ground electrode of the semiconductor element formed on the semiconductor wafer surface and the semiconductor elements are screened by connecting the first conductive layer before selectively etched to a ground potential to measure electrical characteristics of the semiconductor elements.

3. The method of manufacturing a semiconductor device according to claim 2, wherein the electrical characteristics include a high frequency characteristic.

4. The method of manufacturing a semiconductor device according to claim 1, wherein the semiconductor element is a field effect transistor.

5. The method of manufacturing a semiconductor device according to claim 1, wherein the first adhesive is a low melting point wax.

6. The method of manufacturing a semiconductor device according to claim 1, wherein at least one of the first wafer holding substrate and second wafer holding substrate is a transparent substrate.

7. The method of manufacturing a semiconductor device according to claim 6, wherein at least one of the first wafer holding substrate and the second wafer holding substrate is formed by a glass plate, quartz plate or sapphire plate.

8. A method of manufacturing a semiconductor device comprising the steps of:

laminating a semiconductor wafer having a plurality of semiconductor elements on a first surface thereof onto a first wafer holding substrate by using a first adhesive so as to contact said first surface to said first wafer holding substrate;

grinding a second surface of said semiconductor wafer on which the semiconductor elements are not formed to form a semiconductor wafer of a prescribed thickness;

coating a first conductive layer on the whole second surface of said semiconductor wafer;

selectively forming a second conductive layer on said first conductive layer in regions aligning to the semiconductor elements formed an said first surface of said semiconductor wafer;

selectively etching the first conductive layer by using the selectively formed second conductive layer as a mask, laminating a second wafer holding substrate on the second conductive layer by using a second adhesive, which is a conductor;

melting the first adhesive to peel off the first wafer holding substrate from the semiconductor wafer and expose the surface of the semiconductor wafer;

selectively etching the semiconductor wafer from the exposed surface so as to be separated into semiconductor elements and partially expose the second adhesive surface, evaluating the semiconductor elements so as to be sorted into non-defectives and defectives; and removing the second adhesive to peel off the second wafer holding substrate from the second conductive layer.

9. The method of manufacturing a semiconductor device according to claim 8, wherein the first conductive layer is electrically connected to a ground electrode of the semiconductor element formed on the semiconductor wafer surface and the semiconductor elements are screened by connecting the second conductive layer to a ground potential to measure electrical characteristics of the semiconductor elements.

10. The method of manufacturing a semiconductor device according to claim 8, wherein the second adhesive, which is a conductor, is a conductive paste.

11. The method of manufacturing a semiconductor device according to claim 10, wherein the conductive paste is a silver paste.

* * * * *

UNITED STATES PATENT AND TRADEMARK OFFICE
CERTIFICATE OF CORRECTION

PATENT NO. : 6,432,743 B2
DATED : August 13, 2002
INVENTOR(S) : Shimada

Page 1 of 1

It is certified that error appears in the above-identified patent and that said Letters Patent is hereby corrected as shown below:

Column 8,
Lines 43-44, "performancer" should read -- performances --.

Signed and Sealed this

Twenty-seventh Day of April, 2004

JON W. DUDAS
*Acting Director of the United States Patent and Trademark Office*